United States Patent
Ferreira et al.

(10) Patent No.: US 6,911,366 B2
(45) Date of Patent: Jun. 28, 2005

(54) METHOD FOR FORMING CONTACT OPENINGS ON A MOS INTEGRATED CIRCUIT

(75) Inventors: Paul Ferreira, Barraux (FR); Philippe Coronel, Barraux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/624,849

(22) Filed: Jul. 22, 2003

(65) Prior Publication Data

US 2004/0212095 A1 Oct. 28, 2004

(30) Foreign Application Priority Data

Jul. 23, 2002 (FR) .............................................. 02 09347

(51) Int. Cl.[7] .......................................... H01L 21/8234
(52) U.S. Cl. ...................... 438/275; 438/197; 438/199; 438/233; 438/525
(58) Field of Search ................................ 438/197, 199, 438/275, 233, 525

(56) References Cited

U.S. PATENT DOCUMENTS 6,309,975 B1 10/2001 Wu et al.
6,426,253 B1 7/2002 Tews et al.
2002/0110976 A1 8/2002 Coronel et al.

OTHER PUBLICATIONS

French Search Report from French Patent Application 02/09347, filed Jul. 23, 2002.

*Primary Examiner*—Long Pham
(74) *Attorney, Agent, or Firm*—Lisa K. Jorgenson; James H. Morris; Wolf, Greenfield & Sacks, P.C.

(57) ABSTRACT

A method for forming contact openings in various locations of the upper surface of an integrated circuit having raised areas, critical openings having to be formed between two neighboring raised areas, including the steps of covering the entire structure with a first protection layer; forming non-critical openings in the first protection layer; coating the structure with a second protection layer; performing an oblique irradiation so that the second protection layer is not irradiated at the bottom of the regions located between two raised areas; removing the non-irradiated portions of the second protection layer; removing the portions of the first protection layer located under the second protection layer at the locations where this second protection layer has been removed; and removing the irradiated portions of the second protection layer.

20 Claims, 3 Drawing Sheets

METHOD FOR FORMING CONTACT OPENINGS ON A MOS INTEGRATED CIRCUIT

BACKGROUND OF THE INVENTION

1. Field of the Invention

The present invention relates to a method for forming contact openings to selected locations of the surface of a MOS integrated circuit.

2. Discussion of the Related Art

For MOS integrated circuits in which the primary structures are of very small dimensions, for example, in which the gate structures have a length smaller than one tenth of a micrometer, one of the limitations to miniaturization is the forming of contact openings to semiconductor areas of the structure. This will be illustrated in relation with FIG. 1.

The left-hand portion of FIG. 1 illustrates an example of a MOS transistor formed in an active area of a substrate 1 delimited by shallow trenches 2 filled with an insulator (STI). This MOS transistor comprises an insulated gate 3 formed on a thin gate insulator layer 4. Gate 3 is conventionally made of polysilicon and gate insulator 4 is silicon oxide, although there currently is a tendency to preferring other insulators with a smaller dielectric constant. This gate is used to delimit a first implanted area 5 in the active area of substrate 1. Then, the gate is surrounded with spacers, for example, as shown, with silicon nitride spacers 7 having an L-shaped cross-section and separated from the gate and from the substrate by a very thin oxide layer. The spacers are used to delimit more heavily-doped source and drain regions 8 and 9 in substrate 1. Preferably, the upper surface of gate 3 and the upper surfaces of source and drain regions 8 and 9 are formed of a layer of a metal silicide to improve the conduction and favor the contact making. Metal silicide areas are indicated in FIG. 1 and in the following drawings by a thick line with no reference numeral.

In the right-hand portion of FIG. 1, two transistors analogous to that of the left-hand portion, arranged side by side without being separated by an insulating area, have been shown. The two adjacent transistors have a common drain/source region 11 on which a contact may be desired to be formed.

A structure in which the gate lengths are of 0.65 nanometer, the widths of lightly-doped areas 5 under spacers 7 are on the order of 60 nm, and the more heavily-doped areas covered with oxide 8, 9, 11 have a width on the order of from 30 to 60 nm, the height of gate 3 above the substrate surface being for example 150 nm, will for example be considered.

A conventional method for forming a contact opening is illustrated in FIG. 2. The entire structure illustrated in FIG. 1 is covered with a protective layer 20, for example, a silicon nitride layer. An insulating layer 21, re-etched by chem-mech etch to have a planar upper surface, is then deposited. Layer 21 is covered with a mask 22. It should be noted that this insulating layer remains in place at the end of the process and must be of fine quality. It results, for example, from a high-density plasma deposition.

Assume that a first contact with a drain/source region 8 close to an insulating region 2 and a second contact with a drain/source region 11 arranged between two adjacent transistors are desired to be established. For this purpose, openings 23 and 24 are formed in mask 22 above the regions which are desired to be reached and insulating layer 21, followed by protection layer 20, is etched to release the contact areas. The function of protection layer 20 is well known per se. This protection layer is used as an etch stop for layer 21 especially to avoid overetching the insulation forming insulating regions 2 between transistors and creating defective regions at the limits of this insulator.

The opening of the first contact to drain/source region 8 poses no critical problem since it is possible to overflow with no inconvenience above insulating layer 2.

However, the opening of the second contact to drain/source region 11 intermediate between two adjacent transistors poses critical problems given the involved dimensions. Indeed, the accuracy of the positioning of mask 22 with respect to the previously-formed layers is on the order of 80 nm. This difference is smaller, in the context of the above-described example, than the distance between region 11 and the tops of the adjacent gates 3. Thus, in case of an excessive shifting of opening 24 of the mask, the silicon nitride above region 11 and above one of the adjacent gates 3 will have to be etched at the same time, which results in a risk of short-circuit after metallization. This compels to increasing the transistor dimensions in order to solve this problem of contact opening forming accuracy.

Although only two types of contact openings have been described hereabove, it should be noted that other opening types will generally be provided, for example, openings enabling directly making contacts on the upper silicided layers of gates 3. These openings generally do not pose very critical problems, conversely to the establishing of contacts towards intermediary regions between neighboring gates.

SUMMARY OF THE INVENTION

The present invention aims at solving the problem of the accuracy of the forming of contact openings towards an intermediary drain/source region between two adjacent transistors.

Further, the present invention aims at solving this problem by using technologies already currently used for the contact opening forming.

To achieve these and other objects, the present invention provides a method for forming contact openings in various locations of the upper surface of an integrated circuit comprising raised areas, some openings called critical openings having to be formed between two neighboring raised areas, comprising the steps of:

covering the entire structure with a first protection layer;

forming non-critical openings in the first protection layer;

coating the entire structure with a second protection layer having the feature of specifically resisting against an etch in the areas where it has not received any irradiation;

performing an oblique irradiation so that the second protection layer is not irradiated at the bottom of the regions located between two raised areas;

removing the non-irradiated portions of the second protection layer;

removing the portions of the first protection layer located under the second protection layer at the locations where this second protection layer has been removed; and removing the irradiated portions of the second protection layer.

According to an embodiment of the present invention, the first protection layer is a silicon nitride layer.

According to an embodiment of the present invention, the second protection layer is a polysilicon layer.

According to an embodiment of the present invention, the irradiation is a boron implantation.

According to an embodiment of the present invention, the oblique irradiation is performed under an angle from 45 to 60°.

According to an embodiment of the present invention, the raised areas correspond to gate areas of MOS transistors.

According to an embodiment of the present invention, the areas likely to be contacted are coated with a metal silicide.

According to an embodiment of the present invention, the step of the forming of non-critical openings in the first protection layer comprises the steps of coating the structure with a planarized layer, removing the planarized layer at the locations of said non-critical openings, etching said openings in the first protection layer, and removing the planarized layer.

According to an embodiment of the present invention, the planarized layer is a resin layer.

The foregoing objects, features and advantages of the present invention will be discussed in detail in the following non-limiting description of specific embodiments in connection with the accompanying drawings.

DETAILED DESCRIPTION

Generally, the present invention provides a contact opening forming method in which non-critical openings are formed in the same way as described previously in relation with prior art and in which critical openings between two close gate regions are formed by a specific method compatible with the general contact opening method and which do not adversely affect the openings already formed by the conventional method.

Figure 2:
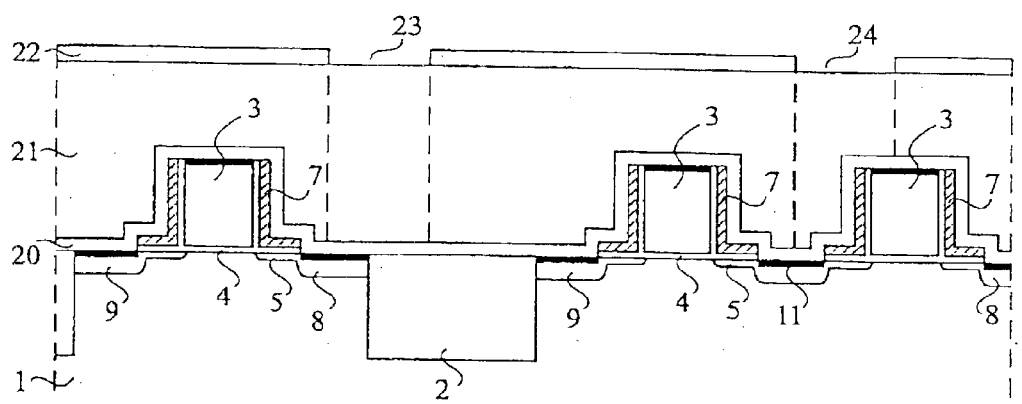
FIG. 2 illustrates a contact opening method according to prior art.
Figure 3:
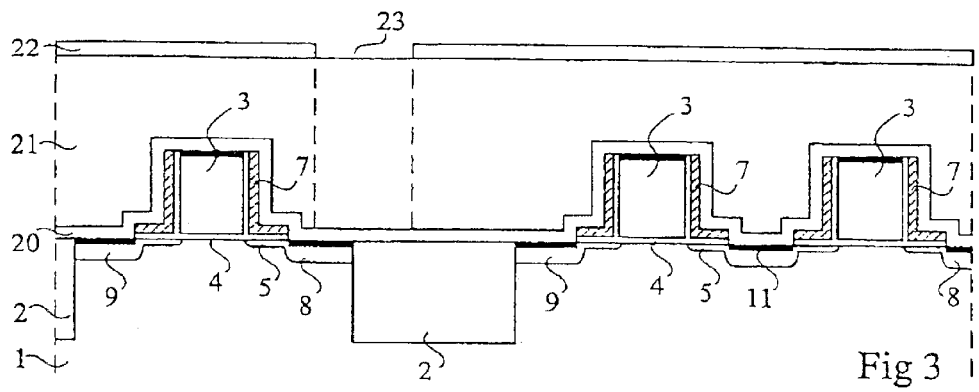
FIGS. 3 to 6 illustrate successive steps of a contact opening method according to the present invention.

More specifically, FIG. 3 shows the structure according to the present invention at the same stage as described in relation with FIG. 2, that is, after deposition of a protection layer 20, of a planarized insulating layer 21, and of a masking layer 22. However, as will be noted hereafter, layer 21 is then removed in the method according to the present invention and should not necessarily exhibit excellent dielectric qualities. Layer 21 may thus for instance be a simple resin layer, which simplifies the manufacturing.

All non-critical openings are formed in a first step by forming openings 23 in mask 22 as described in relation with FIG. 2 above non-critical areas. Openings 23 are used to delimit an anisotropic etch of insulating layer 21. This etch stops when protection layer 20, for example, a silicon nitride layer having a thickness of 30 nm, is reached. Then, layer 20 is etched to form openings above the previously-defined non-critical locations.

Figure 4:
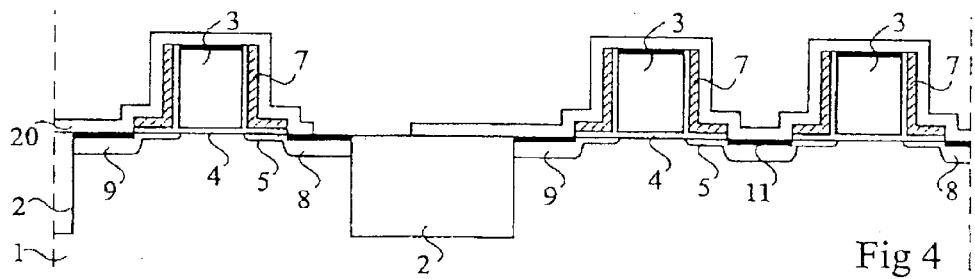

After this step, as illustrated in FIG. 4, mask 22 and planarized insulating layer 21 are removed.

Figure 5:
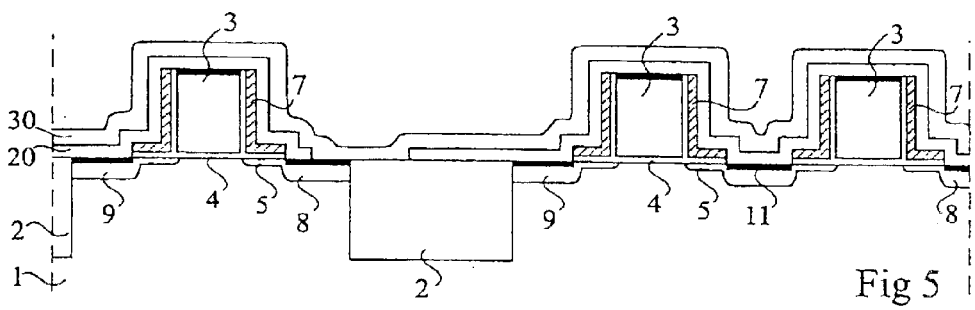

At a next step, as illustrated in FIG. 5, a second protection layer 30, for example, polysilicon having for example a thickness on the order of 20 nm is deposited over the entire structure by a low-temperature deposition method. Then, to reach the structure illustrated in FIG. 6, the steps described in relation with FIGS. 7A to 7C are carried out.

Figure 1:
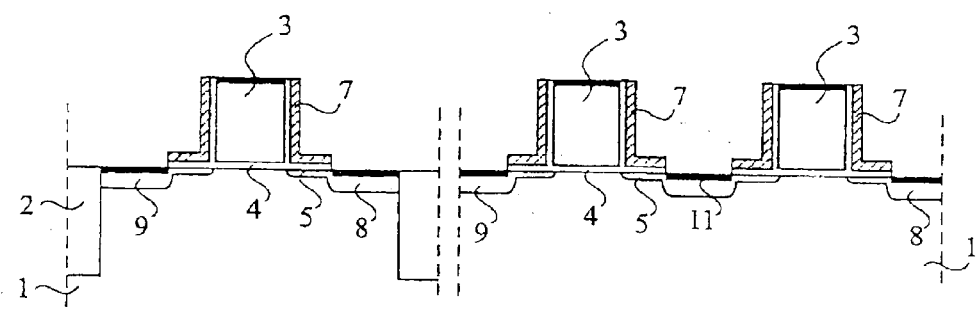
FIG. 1 illustrates MOS transistor structures according to prior art.
Figure 7A:
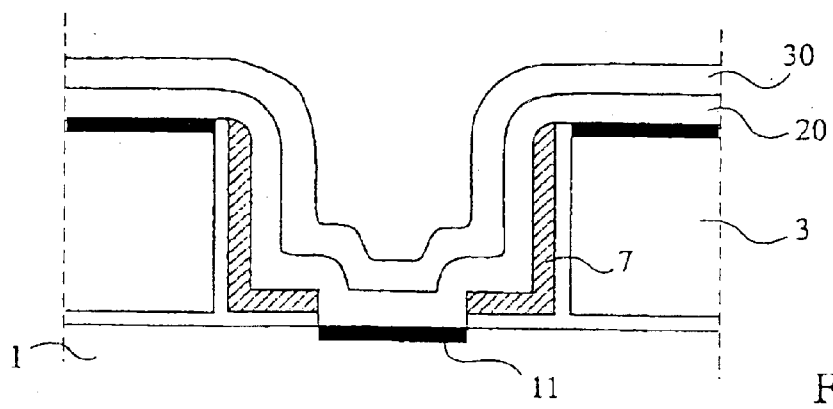
FIGS. 7A to 7C are partial views illustrating intermediary steps between the steps of FIGS. 5 and 6.

FIG. 7A shows an enlargement of the portion arranged between two gate areas and corresponds to what has been shown in the right-hand portion of FIG. 1. The structure is covered on the one hand with silicon nitride layer 20, on the other hand with polysilicon layer 30.

Figure 7B:
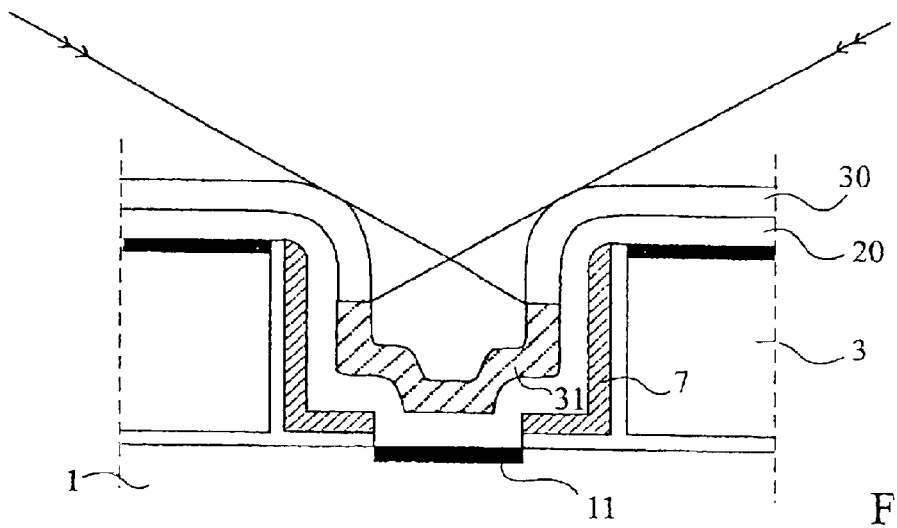

At the next step, illustrated in FIG. 7B, a low-dose and low-power oblique implantation, for example, of boron under 1 keV according to a reference angle ranging between 45 and 60 degrees is performed while the wafer is assembled on a rotating support. As a result, deep portion 31 of polysilicon layer 30, located under the irradiation layer and hatched in FIG. 7B, is not irradiated. Polysilicon has the property according to which non-irradiated areas can be selectively etched with respect to irradiated areas.

Figure 7C:
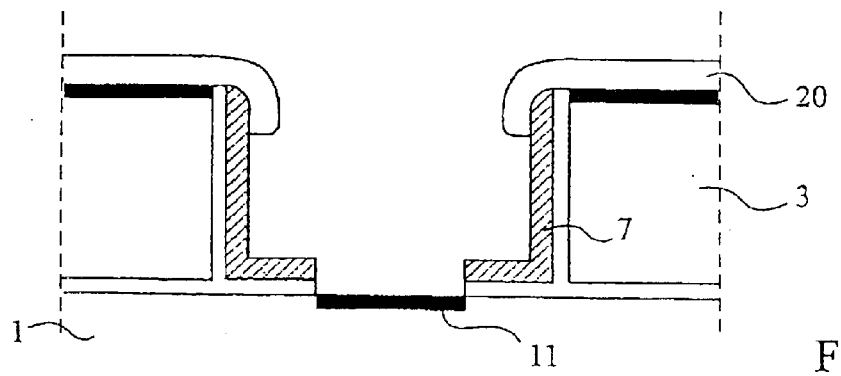

At the next step, illustrated in FIG. 7C, deep polysilicon portion 31 is removed, after which, by using the remaining polysilicon layer as an etch mask, the portion of silicon nitride layer 20 which was arranged under and around the removed polysilicon region is removed. This etch is performed in a limited time since it is desired to completely eliminate nitride layer 20 between the spacers, without completely removing these spacers which, in the described example of application, are also made of silicon nitride. After this, the portion of polysilicon layer 30 not submitted to an implantation is removed and there remains in place, as illustrated in FIG. 7C, a portion of nitride layer 20 over the entire structure except at the bottom of the narrow areas between two gates. Thus, the contact opening towards drain/source region 11 common to two adjacent transistors is widely exposed to as far as the limit between spacers 7.

Figure 6:
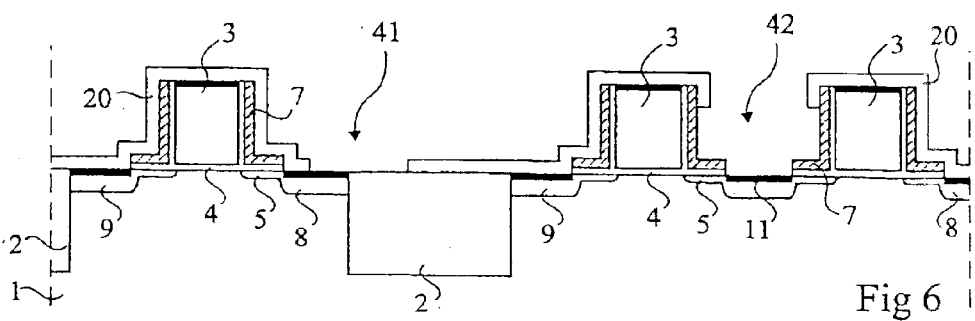

As shown by the general view of FIG. 6, openings in silicon nitride layer 20, on the one hand, at locations 41 arranged opposite to openings 23 made in mask 22 as illustrated in FIG. 3, on the other hand, at locations 42 arranged between two adjacent transistors, that is, between two raised superstructures with respect to the rest of the integrated circuit, have been obtained by means of the present invention.

According to an advantage of the present invention, openings 42 take up the entire width between opposite spacers 7 and the contact which will be formed afterwards will thus be particularly effective. It should also be noted that, while the polysilicon layer is being irradiated, it is irradiated everywhere except at the locations between two opposite superstructures.

After the step illustrated in FIG. 6, a metallization may be performed in any chosen manner. For example, again, the structure may be covered with a planarized insulating layer, a mask may be formed on this structure, relatively wide openings may be formed therein, the planarized layer may be anisotropically etched, and these openings may be filled with a metal to thus form relatively wide vias contacting openings 41 and 42.

It is also possible to deposit a conductive layer over the entire structure, then re-etch this conductive layer to leave it in place only at the desired locations, that is, especially above contact openings 41 and 42. In this case, the intervals between the areas left in place of the conductive layer are then filled with an insulating material. This is for example performed by the deposition a layer of an insulating material followed with a chem-mech re-etch.

An advantage of the present invention is that, during the forming of openings 42, the upper gate portions are well protected and that any risk of a short-circuit is avoided.

Although the present invention has been described in relation with a specific application, it should be noted that, generally, the present invention provides a method for forming contact openings in various locations of the upper surface of an integrated circuit comprising superstructures or raised areas. These raised areas, as described, may correspond to MOS transistor gates or, for example, to stackings of memory point gates. In this method, it is aimed on the one hand at forming openings in various non-critical locations between two superstructures (gate or gate stacking). For this purpose, according to the present invention:

a first protection layer which, in the previously-described embodiment, is nitride layer 20 but which could be made of any other material exhibiting appropriate insulation, protection, and etch selection properties, is deposited, openings are formed at the non-critical locations in this first protection layer, the structure is coated with a second protection layer which, in the specific described embodiment, is a polysilicon layer but which may generally be made of any material that has etch properties which vary according to whether it has been irradiated or not, and an oblique implantation is performed while the wafer is rotated to implant the entire upper surface of the structure and to thus be able to selectively etch the bottom of these critical regions between two superstructures.

Of course, the present invention is likely to have various alterations, modifications, and improvements which will readily occur to those skilled in the art. In particular, the various orders of magnitude of the dimensions have been given as an example only. It should be understood that the present invention aims at solving the problem of the creation of critical openings between two superstructures in the case where the mask alignment tolerances risk being smaller than the distance between an area which is desired to be contacted and an adjacent region.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming contact openings in various locations of the upper surface of an integrated circuit comprising raised areas, some openings called critical openings having to be formed between two neighboring raised areas, comprising the steps of:

covering the entire structure with a first protection layer;

forming non-critical openings in the first protection layer;

coating the entire structure with a second protection layer having the feature of specifically resisting against an etch in the areas where it has not received any irradiation;

performing an oblique irradiation so that the second protection layer is not irradiated at the bottom of the regions located between two raised areas;

removing the non-irradiated portions of the second protection layer;

removing the portions of the first protection layer located under the second protection layer at the locations where this second protection layer has been removed; and removing the irradiated portions of the second protection layer.

2. The method of claim 1, wherein the first protection layer is a silicon nitride layer.

3. The method of claim 1, wherein the second protection layer is a polysilicon layer.

4. The method of claim 3, wherein the irradiation is a boron implantation.

5. The method of claim 1, wherein the oblique irradiation is performed under an angle from 45 to 60°.

6. The method of claim 1, wherein the raised areas correspond to gate areas of MOS transistors.

7. The method of claim 1, wherein the areas likely to be contacted are coated with a metal silicide.

8. The method of claim 1, wherein the step of the forming of non-critical openings in the first protection layer comprises the steps of:

coating the structure with a planarized layer, removing the planarized layer at the locations of said non-critical openings, etching said openings in the first protection layer, and removing the planarized layer.

9. The method of claim 8, wherein the planarized layer is a resin layer.

10. A method for forming contact openings in various locations of an upper surface of an integrated circuit comprising raised areas, wherein some openings are formed between two neighboring raised areas, comprising:

covering the structure with a first protection layer;

forming openings in the first protection layer;

coating the structure with a second protection layer having a feature of specifically resisting against an etch in the areas where it has not received any irradiation;

performing an oblique irradiation so that the second protection layer is not irradiated at a bottom of the regions located between two raised areas;

removing the non-irradiated portions of the second protection layer;

removing the portions of the first protection layer located under the second protection layer at the locations where this second protection layer has been removed; and removing the irradiated portions of the second protection layer.

11. The method of claim 10, wherein the first protection layer is a silicon nitride layer.

12. The method of claim 10, wherein the second protection layer is a polysilicon layer.

13. The method of claim 12, wherein the irradiation is a boron implantation.

14. The method of claim 10, wherein the oblique irradiation is performed under an angle from 45 to 60°.

15. The method of claim 10, wherein the raised areas correspond to gate areas of MOS transistors.

16. The method of claim 10, wherein the areas likely to be contacted are coated with a metal silicide.

17. The method of claim 10, wherein the forming openings in the first protection layer comprises:

coating the structure with a planarized layer, removing the planarized layer at the locations of said openings, etching said openings in the first protection layer, and removing the planarized layer.

18. The method of claim 17, wherein the planarized layer is a resin layer.

19. The method of claim 10, wherein the openings are critical openings.

20. The method of claim 19, wherein forming openings in the first protection layer comprises forming non-critical openings.

* * * * *